US011276998B2

(12) United States Patent
Maddox

(10) Patent No.: US 11,276,998 B2
(45) Date of Patent: Mar. 15, 2022

(54) SYSTEM AND METHOD FOR CALIBRATING TO AND MONITORING OF LOW VOLTAGE CIRCUITS

(71) Applicant: Sean Patrick Maddox, Phoenix, AZ (US)

(72) Inventor: Sean Patrick Maddox, Phoenix, AZ (US)

( * ) Notice: Subject to any disclaimer, the term of this patent is extended or adjusted under 35 U.S.C. 154(b) by 0 days.

(21) Appl. No.: 16/989,504

(22) Filed: Aug. 10, 2020

(65) Prior Publication Data

US 2021/0036501 A1 Feb. 4, 2021

Related U.S. Application Data

(60) Provisional application No. 63/056,407, filed on Jul. 24, 2020.

(51) Int. Cl.
*H02H 1/00* (2006.01)
*H02H 3/24* (2006.01)

(52) U.S. Cl.
CPC ............ *H02H 1/0007* (2013.01); *H02H 3/24* (2013.01)

(58) Field of Classification Search
CPC .............. G01R 31/2829; G01R 35/005; H02H 1/0007; H02H 3/24
See application file for complete search history.

(56) References Cited

U.S. PATENT DOCUMENTS 10,825,334 B2 * 11/2020 Pedersen .............. G08B 29/043
11,127,284 B1 * 9/2021 Barson ................. G08B 17/107
2018/0196101 A1 * 7/2018 Qu ......................... G01R 27/16

* cited by examiner

*Primary Examiner* — Jared Fureman
*Assistant Examiner* — Nicolas Bellido

(57) ABSTRACT

A system for monitoring low voltage electrical circuits for changes in their electrical characteristics corresponding to changes in their physical characteristics. The system includes a device which provides the electrical origination and termination for low voltage electrical circuits and the logic necessary to measure the electrical characteristics of low voltage electrical circuits and detect changes in the electrical characteristics of low voltage electrical circuits. The system includes a method for calibrating to the unique electrical characteristics of individual low voltage circuits with this method producing a circuit specific configuration for each low voltage electrical circuit and that configuration being utilized by the device to monitor each individual low voltage circuit.

2 Claims, 6 Drawing Sheets

200

110
201
PROCESSORS
202
203
PERSISTENT STORAGE
CALIBRATION LOGIC
204
COMPARATIVE LOGIC
205
EVENT HANDLING LOGIC
206
207
208
COMMUNICATION INTERFACE
211
REFERENCE
210
POTENTIOMETER
212
COMPARATOR
209
CONVERTER
111
112
213

SYSTEM AND METHOD FOR CALIBRATING TO AND MONITORING OF LOW VOLTAGE CIRCUITS

CROSS REFERENCE TO RELATED APPLICATIONS

No cross reference to related applications are known.

FIELD

The present disclosure relates to low voltage electrical circuit monitoring devices. In particular, an embodiment of the present disclosure relates to a system and method for calibrating to and monitoring of low voltage circuits including, but not limited to, intrusion detection systems, presence detection systems and smoke/fire detection systems.

BACKGROUND

In the following description, numerous specific details are set forth. However, it is understood that embodiments of the disclosure may be practiced without these specific details. In other instances, well-known circuits, structures, and techniques have not been shown in detail in order not to obscure the understanding of this description.

BRIEF DESCRIPTION OF THE DRAWINGS

Embodiments of the disclosure may best be understood by referring to the following description and accompanying drawings that are used to illustrate embodiments of the disclosure by way of example and not limitation. In drawings, in which like reference numerals indicate similar elements.

DETAILED DESCRIPTION

Figure 1:
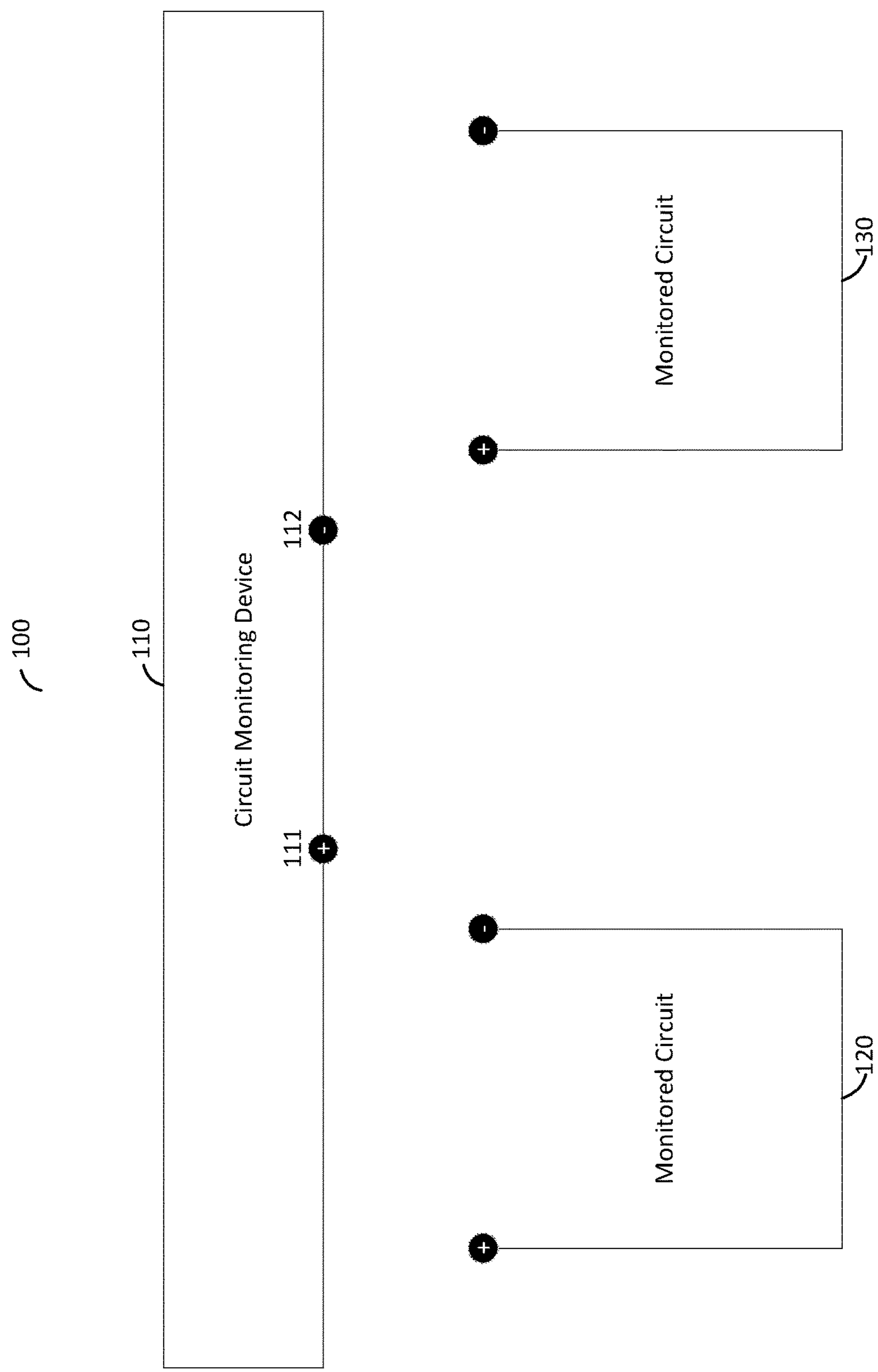
FIG. 1 illustrates an exemplary hardware environment in which embodiments of the disclosure may be practiced.

In the following description, numerous specific details are set forth. However, it is understood that embodiments of the disclosure may be practiced without these specific details. In other instances, well-known circuits, structures, and techniques have not been shown in detail in order not to obscure the understanding of this description.

Disclosed herein, one embodiment of the disclosure is directed to a system and a method for calibrating to and monitoring of low voltage circuits.

Of course, other features and advantages of the disclosure will be apparent from the accompanying drawings and from the detailed description that follows below.

In the following description, certain terminology is used to describe features of the disclosure. For example, in certain situations, the term "logic" is representative of hardware, firmware and/or software that is configured to perform one or more functions. As hardware, logic may include circuitry having data processing or storage functionality. Examples of such circuitry may include, but are not limited or restricted to a microprocessor, one or more processor cores, a programmable gate array, a microcontroller, an application specific integrated circuit, a semiconductor memory or a combinatorial logic.

Logic may be software in the form of one or more software modules, such as executable code in the form of an executable application, an application programming interface (API), a subroutine, a function, a procedure, an applet, a servlet, a routine, source code, object code, a shared library/dynamic load library or one or more instructions. The software modules may be stored in any type of suitable non-transitory storage medium, or transitory storage medium (e.g. electrical, optical, acoustical or other form of propagated signals such as carrier waves, infrared signals, or digital signals). Examples of non-transitory storage medium may include, but are not limited or restricted to a programmable circuit; a semiconductor memory; non-persistent storage such as volatile memory (e.g., any type of random access memory "RAM"); persistent storage such as non-volatile memory (e.g., read-only memory "ROM", power-backed RAM, flash memory, phase-change memory, etc.), a solid-state drive, a hard disk drive, an optical disc drive, or a portable memory device. As firmware, the executable code is stored in persistent storage.

Sensors may be devices that are capable of communicating state via electrical characteristics including, but not limited to, voltage, current and resistance. Sensor state communicated via electrical characteristics may include, but are not limited to, the sensors state which represents the sensor has or is sensing the presence of the stimuli which it is designed to sense, the sensors state which represents the sensor has not or is not sensing the presence of the stimuli that it is designed to sense, sensor test events, sensor maintenance events and sensor tamper events. It should be understood that a sensor that has not or is not sensing the presence of the stimuli that it is designed to sense is in its inactive state. Further it should be understood that a sensor that has or is sensing the presence of the stimuli that it is designed to sense is in its active state. A sensors communication of state change may be in the form of a change to one or more electrical characteristics emanating from the sensor and may be produced and emanated actively or passively by the sensor. Sensors may be electrically active or electrically passive devices. Sensors may be electrically normally open or electrically normally closed devices and may consist of zero, one or more poles and zero, one or more throws. If so indicated for a sensor the normally open, normally closed or positive connection indicator shall be what is referred to within this disclosure as the sensors "positive connection". If so indicated for a sensor the COM, C or negative connection indicator shall be what is referred to within this disclosure as the sensors "negative connection".

FIG. 1 illustrates an exemplary hardware environment 100 in which embodiments of the disclosure may be practiced. Exemplary circuit monitoring device 110 is provided and monitored circuits 120 and 130 are provided. Monitored circuits 120 and 130 are examples of circuits that circuit monitoring device 110 may monitor. Monitored circuits 120 and 130 are not part of what is claimed by this disclosure. Monitored circuits 120 and 130 do not limit or restrict, in any way, the circuits that circuit monitoring device 110 may monitor. Circuit monitoring device 110 is equipped with positive electrical pole 111 and negative electrical pole 112.

Circuit monitoring device 110 is physically connected to monitored circuits via positive electrical pole 111 and negative electrical pole 112. Circuit monitoring device 110 supplies a known, constant electrical voltage and makes available a known maximum electrical current on positive electrical pole 111. Circuit monitoring device 110 supplies a known, constant electrical resistance and a path to ground on negative electrical pole 112.

Of course, it should be understood that the present disclosure is not limited by the number of circuit monitoring devices present, the electrical pole quantity or configurations of the circuit monitoring device, the number of monitored circuits or the types of monitored circuits with which each circuit monitoring devices is associated.

Figure 2:
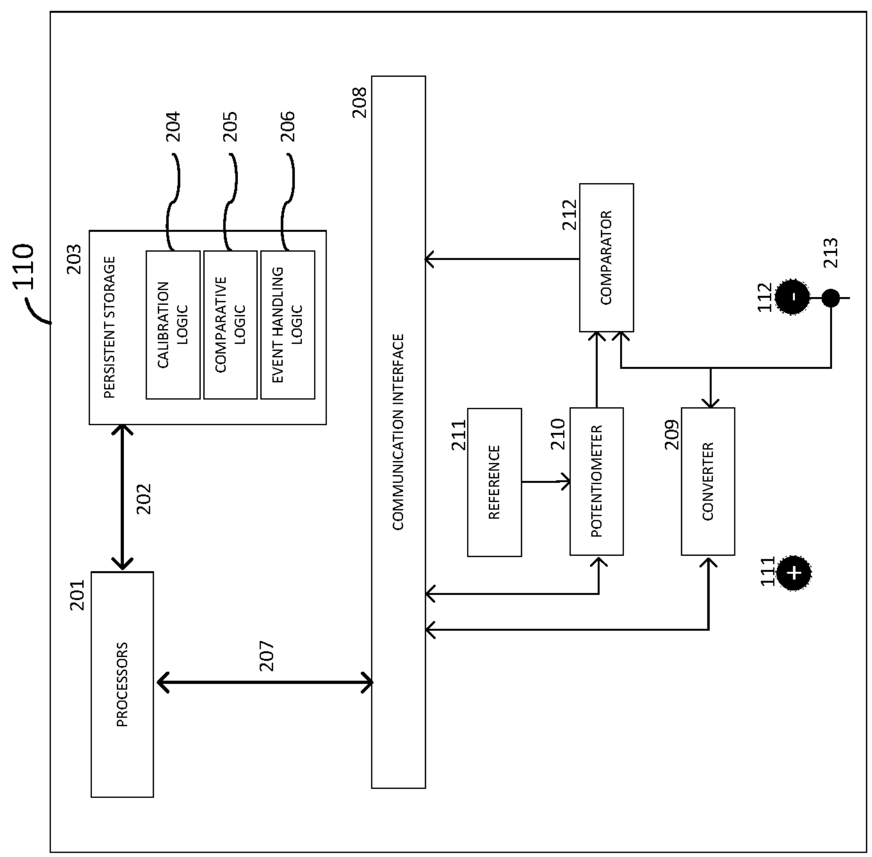
FIG. 2 is an exemplary block diagram of logic associated with a circuit monitoring device.

Referring now to FIG. 2, an exemplary block diagram 200 of logic associated with circuit monitoring device 110 is shown. Circuit monitoring device 110 comprises one or more processors 201 that are coupled to communication interface 208 via a transmission medium 207. Communication interface 208 is coupled to converter 209, potentiometer 210 and comparator 212.

Processors 201 is further coupled to persistent storage 203 via transmission medium 202. According to one embodiment of the disclosure, persistent storage 203 may include calibration logic 204, comparative logic 205 and event handling logic 206. Of course, when implemented as hardware, comparative logic 205 would be implemented separately from persistent storage 203. Converter 209 and comparator 212 are coupled to the input of negative electrical pole 112 via tap point 213. Reference 211 is coupled to potentiometer 210 and potentiometer 210 is coupled to comparator 212.

It should be understood that the present disclosure is not limited to a minimum or maximum number of positive electrical poles, negative electrical poles, tap points, converters, comparators, potentiometers and references. The present disclosure may include a quantity of one or more positive electrical poles, negative electrical poles, tap points, converters, comparators, potentiometers and references. The present disclosure may implement converters, comparators, potentiometers and references as hardware, software or a combination of both.

Figure 3:
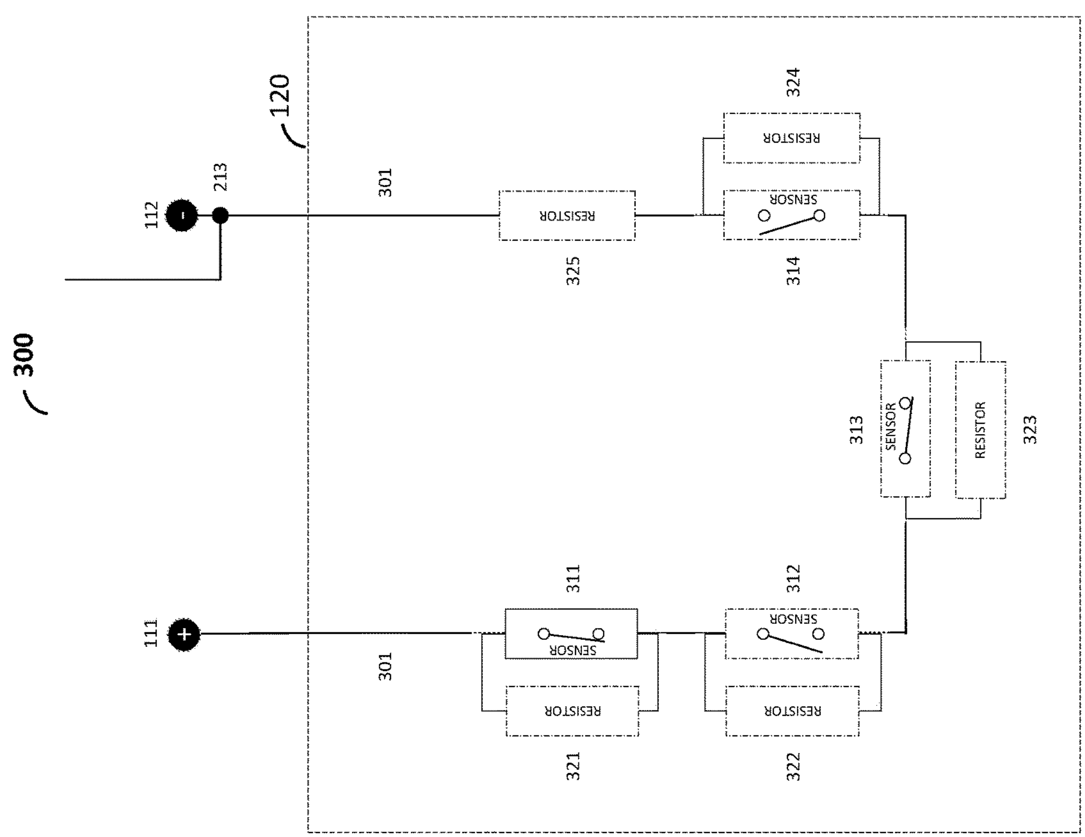
FIG. 3 is a block diagram of logic associated with a first example of a circuit to be monitored by a circuit monitoring device.

Referring now to FIG. 3, a block diagram 300 of logic associated with monitored circuit 120 is shown. It should be understood that the present disclosure does not assert claim to monitored circuit 120 except as it relates to positive electrical pole 111, negative electrical pole 112 and tap point 213. Block diagram 300, monitored circuit 120 and the elements which comprise monitored circuit 120 are shown as an example of a circuit calibrated to and monitored by circuit monitoring device 110. Block diagram 300 and monitored circuit 120 are provided for illustrative and explanatory purposes only.

Monitored circuit 120 comprises wire 301 which may be a single physical wire connecting to positive electrical pole 111, connecting through all sensors and resistors on the circuit and connecting to negative electrical pole 112 or it may be multiple individual physical wires with the first connecting to positive electrical pole 111 and terminating on the first sensor or resistor on the circuit, additional individual physical wires connecting between each sensor or resistor on the circuit and a last individual physical wire connecting between the last sensor or resistor on the circuit and negative electrical pole 112.

Further monitored circuit 120 comprises sensor 311 and may be comprised of zero or more additional sensors 312, 313, 314 or any combination thereof. Monitored circuits may be comprised of more sensors or resistors than are shown in FIG. 3. Sensors 312, 313 and 314 are shown with dashed boundaries to indicate each may, or may not, be present. Additionally monitored circuit 120 may be comprised of resistors 321, 322, 323, 324, 325, any combination thereof or none. Resistors 321, 322, 323, 324 and 325 are shown with dashed boundaries to indicate each may, or may not, be present.

The positive connection of sensor 311 is coupled to positive electrical pole 111 via wire 301. The negative connection of sensor 311 is coupled to negative electrical pole 112 via wire 301. If sensors 312, 313 or 314 are present the negative connection of sensor 311 is coupled to the positive connection of the sensor immediately adjacent to sensor 311 on the electrical low side of sensor 311. Similarly if sensors 312, 313 or 314 are present the negative connection of each is coupled to the positive connection of the sensor immediately adjacent to it on its electrical low side.

If resistor 321 is present one side of resistor 321 is coupled to wire 301 on the electrical high side of sensor 311 and the other side of resistor 321 is coupled to wire 301 on the electrical low side of sensor 311. Similarly if resistors 322, 323 or 324 are present one side of the resistor is coupled to wire 301 on the electrical high side of its companion sensor (sensor 312, 313 or 314 respectively) and the other side of the resistor is coupled to wire 301 on the electrical low side of its companion sensor (sensor 312, 313 or 314 respectively).

If resistor 325 is present one side of resistor 325 is coupled to wire 301 on the electrical low side of the sensor immediately adjacent to resistor 325 on the electrical high side of wire 301 relative to resistor 325 and the other side of resistor 325 is coupled to wire 301 on the electrical high side of negative electrical pole 112 and wire 301 is coupled to negative electrical pole 112. If resistor 325 is not present the sensor immediately adjacent to negative electrical pole 112 on electrical high side of negative electrical pole 112 is coupled to wire 301 and wire 301 is coupled to negative electrical pole 112.

Figure 4:
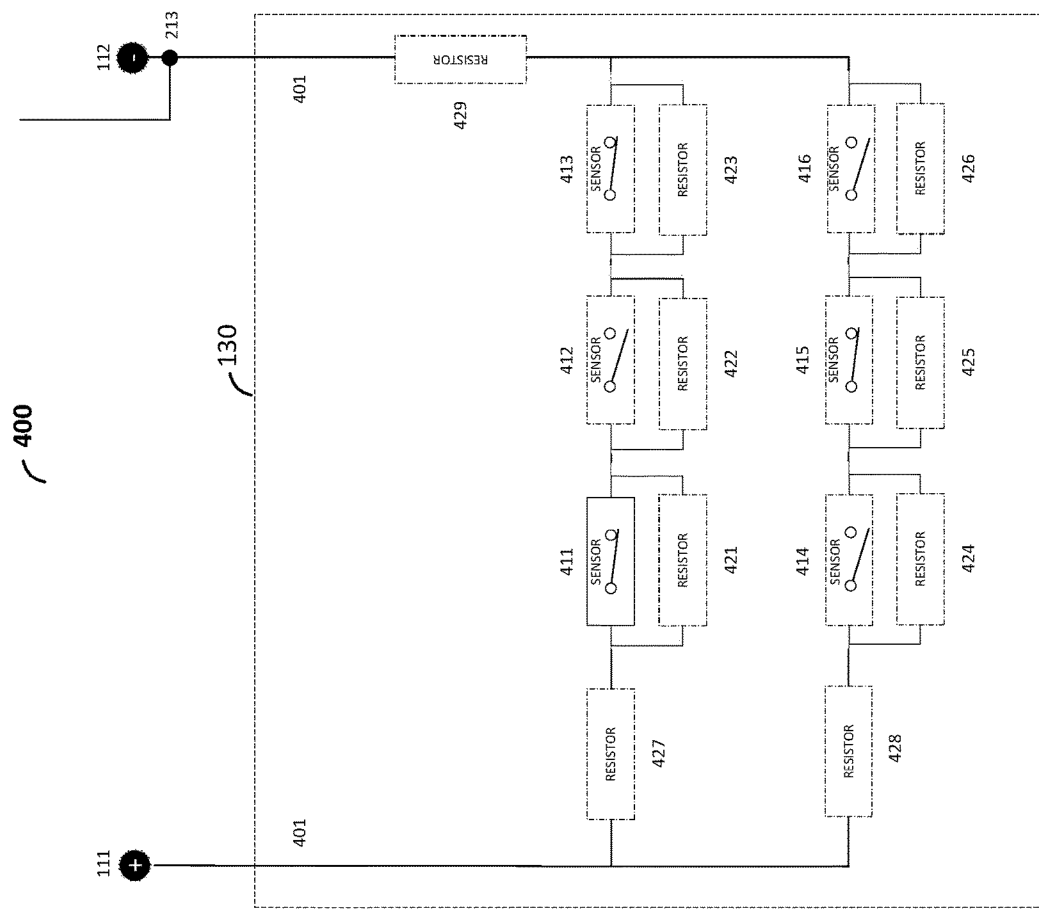
FIG. 4 is a block diagram of logic associated with a second example of a circuit to be monitored by a circuit monitoring device.

Referring now to FIG. 4, a block diagram 400 of logic associated with monitored circuit 130 is shown. It should be understood that the present disclosure does not assert claim to monitored circuit 130 except as it relates to positive electrical pole 111, negative electrical pole 112 and tap point 213. Block diagram 400, monitored circuit 130 and the elements which comprise monitored circuit 130 are shown as an example of a circuit calibrated to and monitored by circuit monitoring device 110. Block diagram 400 and monitored circuit 130 are provided for illustrative and explanatory purposes only.

Monitored circuit 130 comprises wire 401 which may be a single physical wire connecting to positive electrical pole 111, connecting through all sensors and resistors on the circuit and connecting to negative electrical pole 112 or it may be multiple individual physical wires with the first connecting to positive electrical pole 111 and terminating on the first sensor or resistor on the circuit, additional individual physical wires connecting between each sensor or resistor on the circuit and a last individual physical wire connecting between the last sensor or resistor on the circuit and negative electrical pole 112.

Further monitored circuit 130 comprises sensor 411 and may be comprised of zero or more additional sensors 412, 413, 414, 415, 416 or any combination thereof. Monitored circuits may be comprised of more sensors or resistors than are shown in FIG. 4. Sensors 412, 413, 414, 415 and 416 are shown with dashed boundaries to indicate each of them may, or may not, be present. Additionally monitored circuit 130 may be comprised of resistors 421, 422, 423, 424, 425, 426, 427, 428, 429 or any combination thereof or none. Resistors 421, 422, 423, 424, 425, 426, 427, 428 and 429 are shown with dashed boundaries to indicate each of them may, or may not, be present.

The positive connection of sensor 411 is coupled to positive electrical pole 111 via wire 401. If resistor 427 is present one side of resistor 427 is coupled to wire 401 on the electrical high side of wire 401 which is coupled to positive electrical pole 111 and the other side of resistor 427 is coupled to wire 401 on the electrical low side of wire 401 which is coupled to the positive connection of sensor 411. The negative connection of sensor 411 is coupled to negative electrical pole 112 via wire 401. If sensors 412, or 413 are present the negative connection of sensor 411 is coupled to the positive connection of the sensor immediately adjacent to sensor 411 on the electrical low side of sensor 411. Similarly if sensors 412 or 413 are present the negative connection of each is coupled to the positive connection of the sensor immediately adjacent to it on its electrical low side and the negative connection of the sensor immediately adjacent negative electrical pole 112 on the electrically high side of negative electrical pole 112 is coupled to negative electrical pole 112 via wire 401.

If sensor 414 is present the positive connection of sensor 414 is coupled to positive electrical pole 111 via wire 401. If resistor 428 is present one side of resistor 428 is coupled to wire 401 on the electrical high side of wire 401 which is coupled to positive electrical pole 111 and the other side of resistor 428 is coupled to wire 401 on the electrical low side of wire 401 which is coupled to the positive connection of sensor 411. The negative connection of sensor 414 is coupled to negative electrical pole 112 via wire 401. If sensors 415 or 416 are present the negative connection of sensor 414 is coupled to the positive connection of the sensor immediately adjacent to sensor 414 on the electrical low side of sensor 414. Similarly if sensors 415 or 416 are present the negative connection of each is coupled to the positive connection of the sensor immediately adjacent to it on its electrical low side and the negative connection of the sensor immediately adjacent negative electrical pole 112 on the electrically high side of negative electrical pole 112 is coupled to negative electrical pole 112 via wire 401.

If resistor 421 is present one side of resistor 421 is coupled to wire 401 on the electrical high side of sensor 411 and the other side of resistor 421 is coupled to wire 401 on the electrical low side of sensor 411. Similarly if resistors 422, 423, 424, 425, 426, 427, 428 or 429 are present one side of the resistor is coupled to wire 401 on the electrical high side of its companion sensor (sensor 412, 413, 414, 415 or 416 respectively) and the other side of the resistor is coupled to wire 401 on the electrical low side of its companion sensor (sensor 412, 413, 414, 415 and 416 respectively).

If resistor 429 is present one side of resistor 429 is coupled to wire 401 on the electrical low side of the sensor immediately adjacent to resistor 429 on the electrical high side of wire 401 relative to resistor 429 and the other side of resistor 429 is coupled to wire 401 on the electrical high side of negative electrical pole 112 and wire 401 is coupled to negative electrical pole 112. If resistor 429 is not present the sensor immediately adjacent to negative electrical pole 112 on electrical high side of negative electrical pole 112 is coupled to wire 401 and wire 401 is coupled to negative electrical pole 112.

Figure 5:
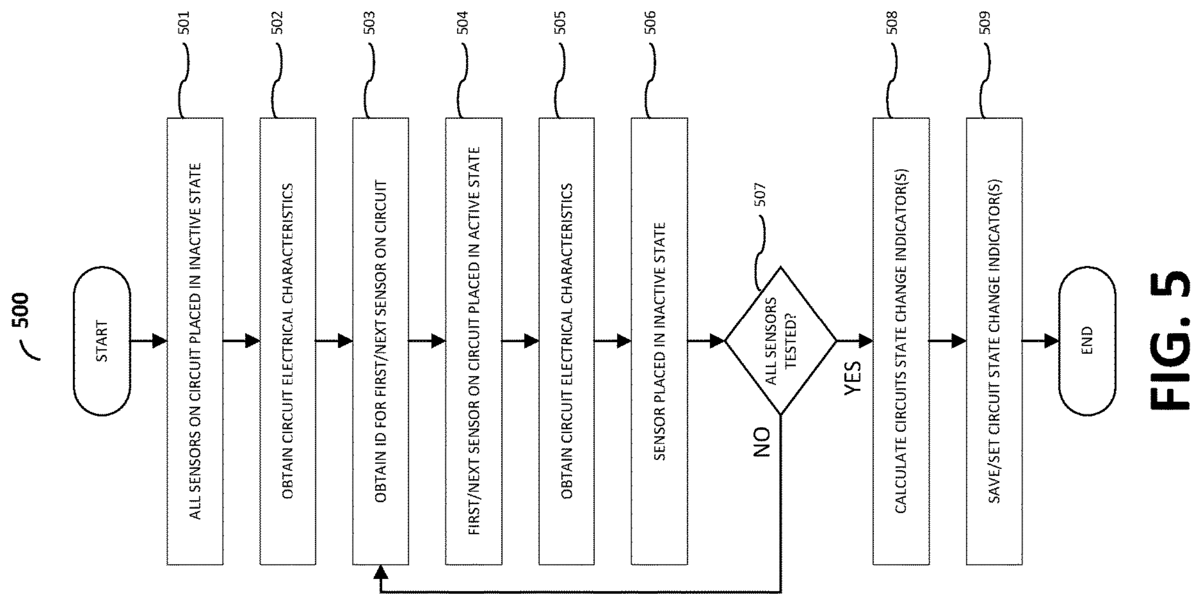
FIG. 5 is an exemplary flow diagram of a method for calibrating a circuit monitoring device to monitor a circuit.

Referring now to FIG. 5, an exemplary flow diagram 500 of a method for calibrating circuit monitoring device 110 to monitor a circuit is shown. The exemplary method for performing a calibration scan utilizes processors 201, persistent storage 203, calibration logic 204, communication interface 208, converter 209, potentiometer 210, reference 211 and tap point 213 of FIG. 2, as described above.

At block 501 each sensor on the circuit to be calibrated to is set to its inactive state as described above. It should be understood that the means by which the state of a sensor is changed is outside the scope of this disclosure.

At block 502 processors 201 executes calibration logic 204 and requests converter 209 sample the circuit at tap point 213 and return the sample results. In one embodiment of circuit monitoring device 110 the sample represents the voltage observed on the circuit. The observed voltage and the known supplied voltage are used to calculate the resistance on the circuit and the current on the circuit. In another embodiment of circuit monitoring device 110 the sample represents the resistance observed on the circuit. The observed resistance and the known supplied resistance are used to calculate the voltage on the circuit and the current on the circuit. In another embodiment of circuit monitoring device 110 the sample represents the current observed on the circuit. The observed current and the known supplied current are used to calculate the voltage on the circuit and the resistance on the circuit. The observed and calculated electrical characteristics (voltage, resistance, current) define a circuit profile that represents the physical state of a circuit when zero, one or more sensors present on a circuit are in their active and inactive states. This first circuit profile represents the physical state of the circuit being evaluated when all sensors present on the circuit being evaluated are in their inactive states and is known as the circuit inactive state profile.

At block 503 a unique identifier for the sensor to be evaluated is obtained. It should be understood that the methods by which the unique identifier is generated and obtained may include, but are not limited to, generation by and obtained from circuit monitoring device 110 directly and generation and obtainment from input that is external to circuit monitoring device 110.

At block 504 the sensor to be evaluated is changed from its inactive state to its active state. It should be understood that the methods by which the sensor state is changed may include, but are not limited to, the introduction or removal of the stimuli that the sensor is designed to sense, the manual actuation of the sensor state change or the mechanical actuation of the sensor state change.

At block 505 processors 201 executes a portion of calibration logic 204. Calibration logic 204 first saves a reference to the circuit inactive profile as the sensor specific inactive circuit profile for the sensor with the unique identifier obtained in block 503. The sensor specific inactive circuit profile defines the electrical characteristics of the circuit when the sensor with the unique identifier obtained in block 503 is in its inactive state. Next calibration logic 204 requests converter 209 sample the circuit and return the sample results to calibration logic 204. As described previously the observed sample may be returned as a value representing the electrical characteristic of voltage, the electrical characteristic of resistance or the electrical characteristic of current. Calibration logic 204 utilizes the observed sample value and the known value that is supplied by circuit monitoring device 110 to calculate the change in the observed electrical characteristic and to calculate any changes to the other electrical characteristics. The observed and calculated electrical characteristics define a circuit profile that represents the physical state of the circuit when the sensor with the unique identifier obtained in block 503 is in its active state, this is the sensor specific active circuit profile. Block 505 defines a sensor specific inactive circuit profile and a sensor specific active circuit profile for each sensor evaluated in blocks 503, 504 and 505.

At block 506 the sensor being evaluated is changed from its active state to its inactive state. It should be understood that the methods by which the sensor state is changed may include, but are not limited to, the introduction or removal of the stimuli that the sensor is designed to sense, the manual actuation of the sensor state change or the mechanical actuation of the sensor state change.

At block 507 a logic decision is made, if all sensors on the circuit have been evaluated the method proceeds to block 508 otherwise the method proceeds to block 503. It should be understood that the methods by which the information required to perform this logic decision is obtained may include, but are not limited to, the comparison of the sensors evaluated during the immediately prior execution of blocks 503, 504, 505 and 506 against a list of sensors known by circuit monitoring device 110 to be on the circuit or from input that is external to circuit monitoring device 110.

At block 508 calibration logic 204 uses the sensor specific inactive circuit profile and the sensor specific active circuit profile for each sensor evaluated in blocks 503, 504, 505 and 506 to calculate the differences between the electrical characteristics of the active circuit profile and inactive circuit profile. Using the sensor specific active circuit profile for each sensor evaluated in blocks 503, 504, 505 and 506 calibration logic 204 identifies the lowest electrical characteristic value for each electrical characteristic with the result being the active circuit electrical characteristic low value. Using the sensor specific active circuit profile for each sensor evaluated in blocks 503, 504, 505 and 506 calibration logic 204 identifies the highest electrical characteristic value for each electrical characteristic with the result being the active circuit electrical characteristic high value. Using the sensor specific inactive circuit profile for each sensor evaluated in blocks 503, 504, 505 and 506 calibration logic 204 identifies the lowest electrical characteristic value for each electrical characteristic with the result being the inactive circuit electrical characteristic low value. Using the sensor specific inactive circuit profile for each sensor evaluated in blocks 503, 504, 505 and 506 calibration logic 204 identifies the highest electrical characteristic value for each electrical characteristic with the result being the inactive circuit electrical characteristic high value. Using the resulting active circuit electrical characteristic high value, the resulting active circuit electrical characteristic low value, the resulting inactive circuit electrical characteristic high value and the resulting inactive circuit electrical characteristic low value calibration logic 204 calculates the circuits' electrical characteristic state change range. The circuits electrical characteristic state change range is the range of electrical characteristic values that represent when the state of the circuit changes. Further for each materially unique electrical characteristic amongst the inactive circuit profiles and active circuit profiles calibration logic 204 may define a unique entity that may be monitored independently of the profile for the physical circuit. Further calibration logic 204 compares the active circuit electrical characteristic high value and the inactive circuit electrical characteristic high value to the known electrical characteristic value supplied by circuit monitoring device 110 via positive electrical pole 111 to determine if the circuit is capable of communicating short circuit tampering events. If calibration logic 204 determines the circuit is capable of communicating short circuit tampering events calibration logic 204 calculates the circuits' short circuit tampering event electrical characteristic state change range. Further calibration logic 204 compares the active circuit electrical characteristic low value and the inactive circuit electrical characteristic low value to the known electrical characteristic value supplied by circuit monitoring device 110 via positive electrical pole 111 to determine if the circuit is capable of communicating wire cut tampering events. If calibration logic 204 determines the circuit is capable of communicating wire cut tampering events calibration logic 204 calculates the circuits' wire cut tampering event electrical characteristic state change range.

At block 509 calibration logic 204 saves the inactive circuit profile for each sensor, the active circuit profile for each sensor, the circuit state change range, any materially unique entities that may be monitored independently of the physical circuit and their associated inactive profile and active profile, the circuits' ability to communicate short circuit tampering events, short circuit state change range (if any), the circuit's ability to communicate wire cut tampering events and wire cut state change range (if any) to persistent storage 203. In one embodiment of the disclosure calibration logic 204 calculates a resistance setting for potentiometer 210 which, when applied to reference 211 that is supplied to potentiometer 210, equates to an electrical characteristic reference produced by potentiometer 210 that is between the low value of the circuit state change range and the high value of the circuit state change range and programs potentiometer 210 with this resistance setting utilizing communication interface 208.

Figure 6:
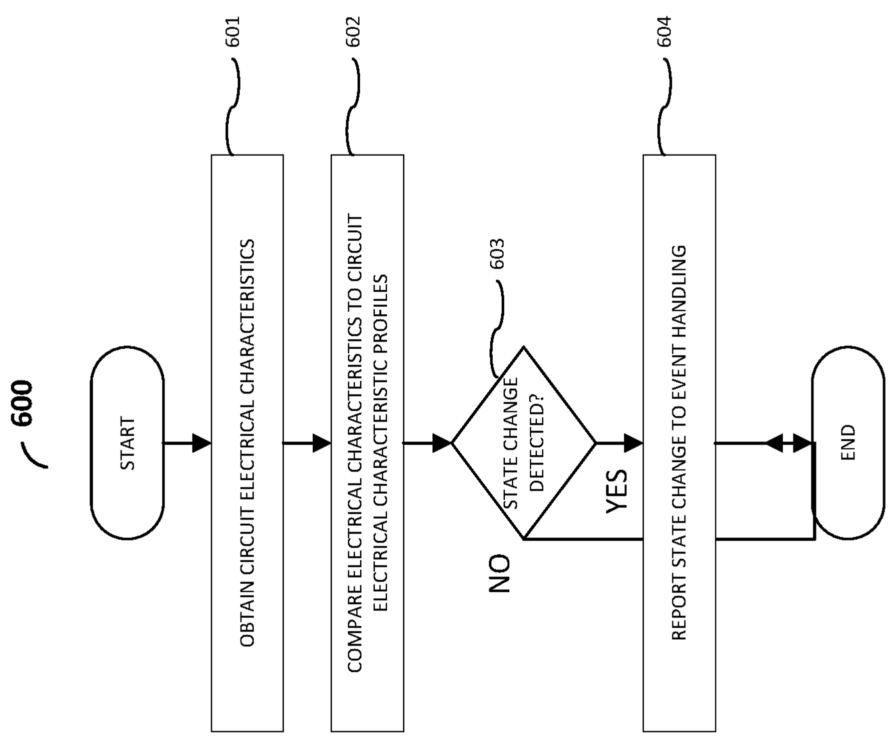
FIG. 6 is an exemplary flow diagram of a method for monitoring a circuit by a circuit monitoring device.

Referring now to FIG. 6, an exemplary flow diagram 600 of a method for monitoring a circuit by circuit monitoring device 110 is shown. The exemplary method for performing a circuit state scan utilizes processors 201, persistent storage 203, comparative logic 205, event handling logic 206, communication interface 208, converter 209, potentiometer 210, reference 211, comparator 212 and tap point 213 of FIG. 2, as described above. Of course, when implemented as hardware, comparative logic 205 would be implemented by comparator 212 and separately from processors 201, persistent storage 203, event handling logic 206 and converter 209.

At block 601 processors 201 executes comparative logic 205 and requests converter 209 sample the circuit at tap point 213 and return the sample results. In one embodiment of circuit monitoring device 110 the sample represents the voltage observed on the circuit. The observed voltage and the known supplied voltage are used to calculate the resistance on the circuit and the current on the circuit. In another embodiment of circuit monitoring device 110 the sample represents the resistance observed on the circuit. The observed resistance and the known supplied resistance are used to calculate the voltage on the circuit and the current on the circuit. In another embodiment of circuit monitoring device 110 the sample represents the current observed on the circuit. The observed current and the known supplied current are used to calculate the voltage on the circuit and the resistance on the circuit. The observed and calculated electrical characteristics (voltage, resistance, current) define the current state of the circuit.

At block 602 processors 201 executes comparative logic 205 and compares the current state of the circuit obtained and calculated in block 601 to the prior state of the circuit, the circuit state change range, the short circuit state change range (if any), the wire cut state change range (if any) and the state change ranges of materially unique entities (if any) to determine if a state change has occurred. Of course, when comparative logic 205 is implemented as hardware, comparator 212 continually compares the electrical characteristic observed at tap point 213 to the electrical characteristic reference provided to it by potentiometer 210 to determine if a state change has occurred and processors 201 is not involved.

At block 603 processors 201 executes comparative logic 205 and a logic decision is made, if the comparison(s) conducted in block 602 reveal a state change the method proceeds to block 604 otherwise the method proceeds to the exit block. Of course, when comparative logic 205 is implemented as hardware, comparator 212 continually compares the electrical characteristic observed at tap point 213 to the electrical characteristic reference provided to it by potentiometer 210 to determine if a state change has occurred and processors 201 is not involved.

At block 604 processors 201 executes comparative logic 205 and delivers a notification to event handling logic 206. Of course, when comparative logic 205 is implemented as hardware, comparator 212 continually compares the electrical characteristic observed at tap point 213 to the electrical characteristic reference provided to it by potentiometer 210 to determine if a state change has occurred, when a state change is determined to have occurred comparator 212 delivers a notification to event handling logic 206 via communication interface 208 and processors 201 is not involved.

Utilizing embodiments of the disclosure described herein enables the calibration to and monitoring of low voltage circuits.

While the invention has been described in terms of various embodiments, the invention should not be limited to only those embodiments described, but can be practiced with modification and alteration within the spirit and scope of the appended claims. The description is to be regarded as illustrative rather than limiting.

What is claimed is:

1. A method for monitoring an electrical circuit, the method comprising:

one or more processors of a device, one or more known supplied electrical voltages of the device, one or more known supplied electrical currents of the device, one or more known supplied electrical resistances of the device, one or more positive electric poles of the device electrically coupled to at least one of the known supplied electrical voltages by a first pathway and electrically coupled to at least one of the known supplied electrical currents by the first pathway, one or more negative electric poles of the device electrically coupled to at least one of the known supplied electrical resistances by a second pathway, one or more monitored circuits electrically coupled to at least one of the positive electric poles and electrically coupled to at least one of the negative electric poles, one or more sensors electrically coupled to at least one of the monitored circuits, one or more tap points of the device electrically coupled to at least one of the monitored circuits by a third pathway, one or more converters of the device electrically coupled to at least one of the processors by a communication interface and electrically coupled to at least one of the tap points by the third pathway and at least one of the converters configured to convert analog electrical characteristics to digital representations of analog electrical characteristics, one or more references of the device, one or more comparators of the device electrically coupled to at least one of the processors by the communication interface and electrically coupled to at least one of the tap points by the third pathway, one or more potentiometers of the device electrically coupled to at least one of the processors by the communication interface and electrically coupled to at least one of the references by a fourth pathway and electrically coupled to at least one of the comparators by a fifth pathway and at least one of the potentiometers configured to apply an electrical characteristic to at least one of the references to produce one or more electrical characteristic references and to supply one or more of the electrical characteristic references to the fifth pathway, at least one of the comparators configured to change its output when the electrical characteristic present on the third pathway changes from higher than the electrical characteristic present on the fifth pathway to lower than the electrical characteristic present on the fifth pathway and to change its output when the electrical characteristic present on the third pathway changes from lower than the electrical characteristic present on the fifth pathway to higher than the electrical characteristic present on the fifth pathway and a comparative logic of the device;

measuring, by at least one of the converters when each of the sensors attached to at least one of the monitored circuits are in their inactive state a first monitored circuit measured electrical characteristic;

calculating, using the first monitored circuit measured electrical characteristic and at least one of the known supplied electrical voltages or at least one of the known supplied electrical currents or at least one of the known supplied electrical resistances a first monitored circuit calculated electrical characteristic;

actuating at least one of the sensors attached to the monitored circuit from its inactive state to its active state;

measuring, by at least one of the converters when at least one of the sensors attached to the monitored circuit has been actuated to its active state a first sensor specific measured electrical characteristic;

calculating, using the first sensor specific measured electrical characteristic and at least one of the known supplied electrical voltages or at least one of the known supplied electrical currents or at least one of the known supplied electrical resistances a first sensor specific calculated electrical characteristic;

calculating, using the first sensor specific measured electrical characteristic, the first sensor specific calculated electrical characteristic, the first monitored circuit measured electrical characteristic and the first monitored circuit calculated electrical characteristic a sensor specific state change range with the sensor specific state change range low value being the lower of the values of the first sensor specific measured electrical characteristic, the first sensor specific calculated electrical characteristic, the first monitored circuit measured electrical characteristic or the first monitored circuit calculated electrical characteristic and the sensor specific state change range high value being the higher of the values of the first sensor specific measured electrical characteristic, the first sensor specific calculated electrical characteristic, the first monitored circuit measured electrical characteristic or the first monitored circuit calculated electrical characteristic;

calculating, using at least one of the calculated sensor specific state change ranges the monitored circuit electrical characteristic state change range;

programming the comparative logic based on the sensor specific state change ranges and the monitored circuit electrical characteristic state change range;

comparing, by the comparative logic the monitored circuit electrical characteristic to the programmed comparative logic;

detecting, by the comparative logic when the monitored circuit electrical characteristic differs from the programmed comparative logic.

2. A device comprising:

one or more processors;

one or more known supplied electrical voltages;

one or more known supplied electrical currents;

one or more known supplied electrical resistances;

one or more positive electric poles electrically coupled to at least one of the known supplied electrical voltages by a first pathway and electrically coupled to at least one of the known supplied electrical currents by the first pathway;

one or more negative electric poles electrically coupled to at least one of the known supplied electrical resistances by a second pathway;

one or more monitored circuits electrically coupled to at least one of the positive electric poles and electrically coupled to at least one of the negative electric poles;

one or more sensors electrically coupled to at least one of the monitored circuits;

one or more tap points electrically coupled to at least one of the monitored circuits by a third pathway;

one or more converters electrically coupled to at least one of the processors by a communication interface and electrically coupled to at least one of the tap points by the third pathway and at least one of the converters configured to convert analog electrical characteristics to digital representations of analog electrical characteristics;

one or more references;

one or more comparators electrically coupled to at least one of the processors by the communication interface and electrically coupled to at least one of the tap points by the third pathway;

one or more potentiometers electrically coupled to at least one of the processors by the communication interface and electrically coupled to at least one of the references by a fourth pathway and electrically coupled to at least one of the comparators by a fifth pathway and at least one of the potentiometers configured to apply an electrical characteristic to at least one of the references to produce one or more electrical characteristic references of the device and to supply one or more of the electrical characteristic references to the fifth pathway;

at least one of the comparators configured to change its output when the electrical characteristic present on the third pathway changes from higher than the electrical characteristic present on the fifth pathway to lower than the electrical characteristic present on the fifth pathway and to change its output when the electrical characteristic present on the third pathway changes from lower than the electrical characteristic present on the fifth pathway to higher than the electrical characteristic present on the fifth pathway and comparative logic;

wherein the device is configured to perform a plurality of operations comprising:

calibrate for monitored circuit event detection through the measurement of monitored circuit electrical characteristics and sensor specific electrical characteristics, the calculation of monitored circuit electrical characteristics and sensor specific electrical characteristics and the programming of comparative logic based on these measurements and calculations;

execute comparative logic to detect state change events.

* * * * *